United States Patent [19]

Etoh et al.

[11] Patent Number: 4,475,181
[45] Date of Patent: Oct. 2, 1984

[54] SEMICONDUCTOR MEMORY

[75] Inventors: Jun Etoh, Hachioji; Ryoichi Hori, Tokyo; Yoshiki Kawajiri, Hachioji; Kiyoo Itoh, Higashikurume, all of Japan

[73] Assignee: Hitachi, Ltd., Tokyo, Japan

[21] Appl. No.: 337,099

[22] Filed: Jan. 5, 1982

[30] Foreign Application Priority Data

Jan. 14, 1981 [JP] Japan ............................ 56-2777[U]

[51] Int. Cl.³ .............................................. G11C 7/00
[52] U.S. Cl. ................................... 365/230; 365/189
[58] Field of Search ................................ 365/189, 230

[56] References Cited

U.S. PATENT DOCUMENTS 4,247,921  1/1981  Itoh et al. ...................... 365/189 X

FOREIGN PATENT DOCUMENTS 2734361  3/1978  Fed. Rep. of Germany ...... 365/230

Primary Examiner—Joseph A. Popek
Attorney, Agent, or Firm—Antonelli, Terry & Wands

[57] ABSTRACT

A semiconductor memory of multiplexed address inputs is made operative to receive column addresses and row addresses through common external address lines and to decode them consecutively in response to first and second strobe signals thereby to select one of memory cells. The semiconductor memory is equipped with address buffers exclusively for column and row addressing operations, respectively, the outputs of which are consecutively transmitted to column decoders and row decoders through common internal address lines.

5 Claims, 10 Drawing Figures

SEMICONDUCTOR MEMORY

BACKGROUND OF THE INVENTION

The present invention relates to a semiconductor memory which is characterized in its memory cell selecting mechanism, and more particularly to a semiconductor memory using MOS transistors.

In a random access memory such as a semiconductor memory, the number of address signal lines required for each multiplication of the memory capacity is increased one by one. Therefore, the restriction to the number of the pins of a package raises a problem when it is intended to increase the capacity of the semiconductor memory per chip.

In order to solve that problem, the so-called "multiplexed address inputs" mechanism is known to the prior art and is generally used in a MOS memory of large capacity. This is a mechanism which is made operative to receive the signals respectively indicating the column and row addresses in the address plane of the memory in a time-division manner from a set of pins. For example, in the MOS memory which is disclosed in "Digest of 1977 IEEE International Solid State Circuit Conference", on pages 12 and 13, both a first address signal indicating the row address and a second address signal indicating the column address are fed in a time dividing manner to a single set of seven address buffers which are provided commonly therefor. Those address buffers are connected with the row decoder by a set of internal address lines and with the column decoder by another set of internal address lines through a set of switches. When the first address signal and then a row address strobe are fed to the address buffers, the decoding operation is performed by the row decoder. During this operation, the aforementioned switches are non-conducting. Next, when the second address signal and then a column address strobe are fed to the address buffers from the outside, the aforementioned switches are turned on to effect the decoding operation by the column decoder. Thus, the row and column decoders consecutively respond until one of the memory cells is selected. On the other hand, in the MOS memory which is disclosed in Japanese Laid-Open of Patent Application No. 55-15793 (in 1980) and U.S. Pat. No. 4,316,263, means for disabling the column decoder upon reception of the first address signal is provided to lower the load capacity of the address buffers thereby to speed up the memory access.

SUMMARY OF THE INVENTION

It is, therefore, an object of the present invention to provide a semiconductor memory of multiplexed address inputs, which is enabled to operate at a higher speed than the prior art.

Another object of the present invention is to provide a semiconductor memory which has its timing control circuit simplified.

A further object of the present invention is to provide a semiconductor memory which is equipped with a memory cell selecting mechanism suitable for a memory of high capacity and density.

In the memory of the multiplexed address inputs of the prior art, it has been found that the address buffers are common among the column and row addresses so that the necessity for twice driving the address buffers during one memory cycle restricts the high speed operation and complicates the timing control circuit.

A feature of the present invention resides in the construction which is equipped with both row address buffers made receptive of a first external address signal from a common external address line thereby to generate an internal address signal indicating the row address and column address buffers made receptive of a second external address signal from the aforementioned external address line thereby to generate an internal address signal indicating the column address.

Another feature of the present invention resides in the construction in which the outputs of the aforementioned row and column address buffers are connected through switch circuits with common internal address lines so that they are transmitted through those common internal address lines to row and column decoders, respectively.

DESCRIPTION OF THE PREFERRED EMBODIMENT

Figure 1:
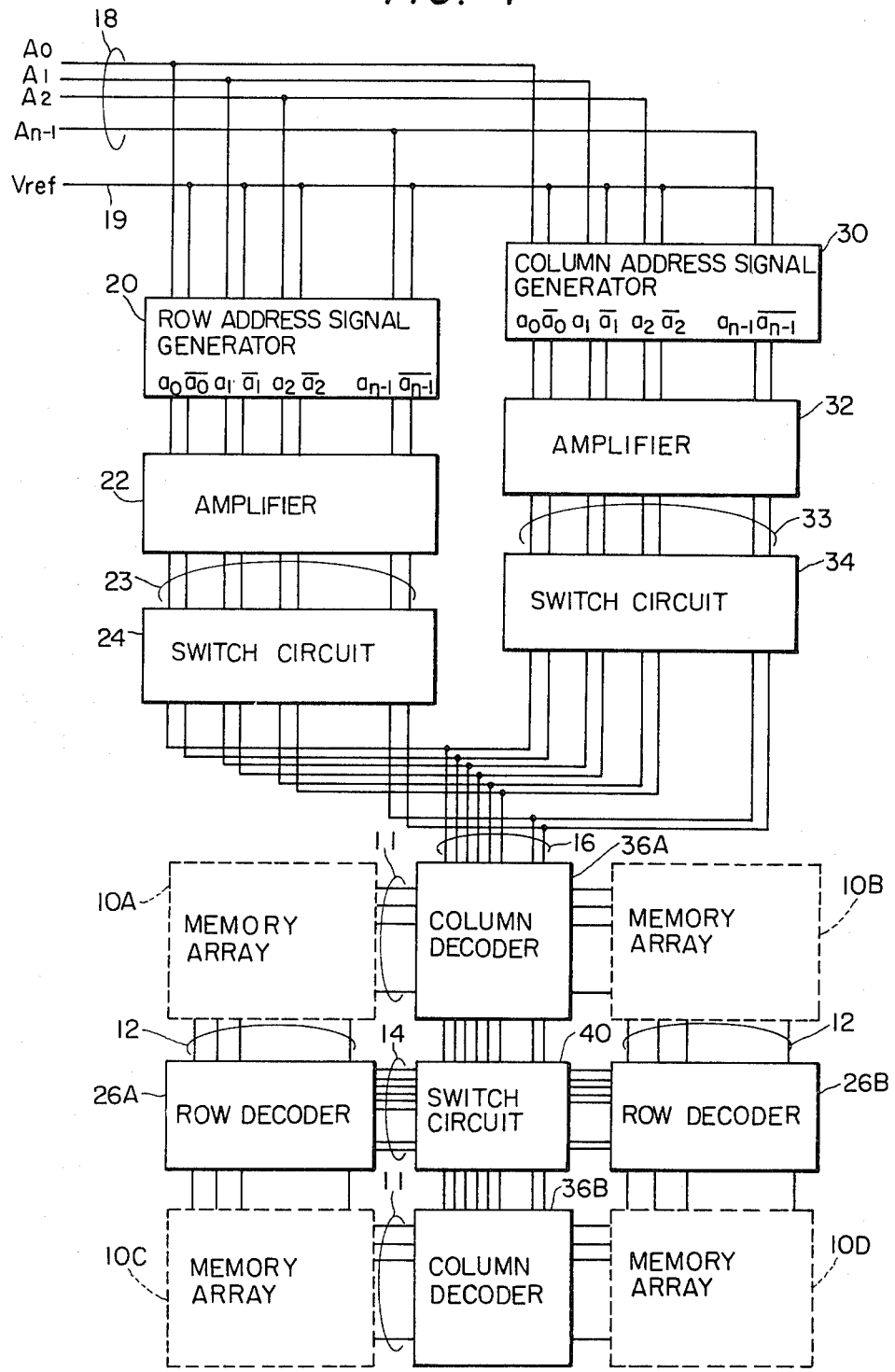
FIG. 1 is a block diagram showing the overall construction of an embodiment of the present invention.

FIG. 1 shows the overall construction of the embodiment of the present invention. The memory arrays, which are composed of a number of memory cells disposed at the points of intersections between column lines 11 and row lines 12, are divided into four portions 10A, 10B, 10C and 10D. Between those memory arrays, there are interposed column decoders 36A and 36B, row decoders 26A and 26B, and a switch circuit 40. External address signals, which are composed of n bits of $A_0$, $A_1$, $A_2$, - - -, and $A_{n-1}$, are fed to external address lines 18 which are composed of n bit lines. The respective bit lines of the external address lines are connected with both a row address signal generator 20 and a column address signal generator 30. On the other hand, a reference voltage line 19, which is held at a reference voltage $V_{ref}$, is also connected with the row address signal generator 20 and the column address signal generator 30. Each of the address bits of the internal address signals generated by the row address signal generator 20 is composed of a pair of true and compensating signals, the former are indicated at $a_0$, $a_1$, - - -, and $a_{n-1}$ whereas the latter being indicated at $\bar{a}_0$, $\bar{a}_1$, - - -, and $\bar{a}_{n-1}$. Similar indications are made for the internal address signals which are generated by the column address signal generator 30.

The address signals generator by the row address signal generating circuit 20 are amplified by an amplifier 22 and are connected through internal address lines 23 with a switch circuit 24. On the other hand, the address signals from the column address signal generator 30 are amplified by an amplifier 32 and are connected through internal address lines 33 with a switch circuit 34. Incidentally, the portion of the row address signal generator 20 and the amplifier 22 can be called a row address buffer, whereas the portion of the column address signal generator 30 and the amplifier 30 can be called a column address buffer.

The outputs from the switch circuits 24 and 34 are connected commonly for each address bit with common address lines 16. These common address lines 16 are made to extend through the column decoder 36A, the switch circuit 40 and the column decoder 36B in this order. On the other hand, row address lines 14 extending through the row decoders 26A and 26B are connected commonly for each bit with the address lines 16 through switches which are contained in the switch circuit 40.

Figure 2:
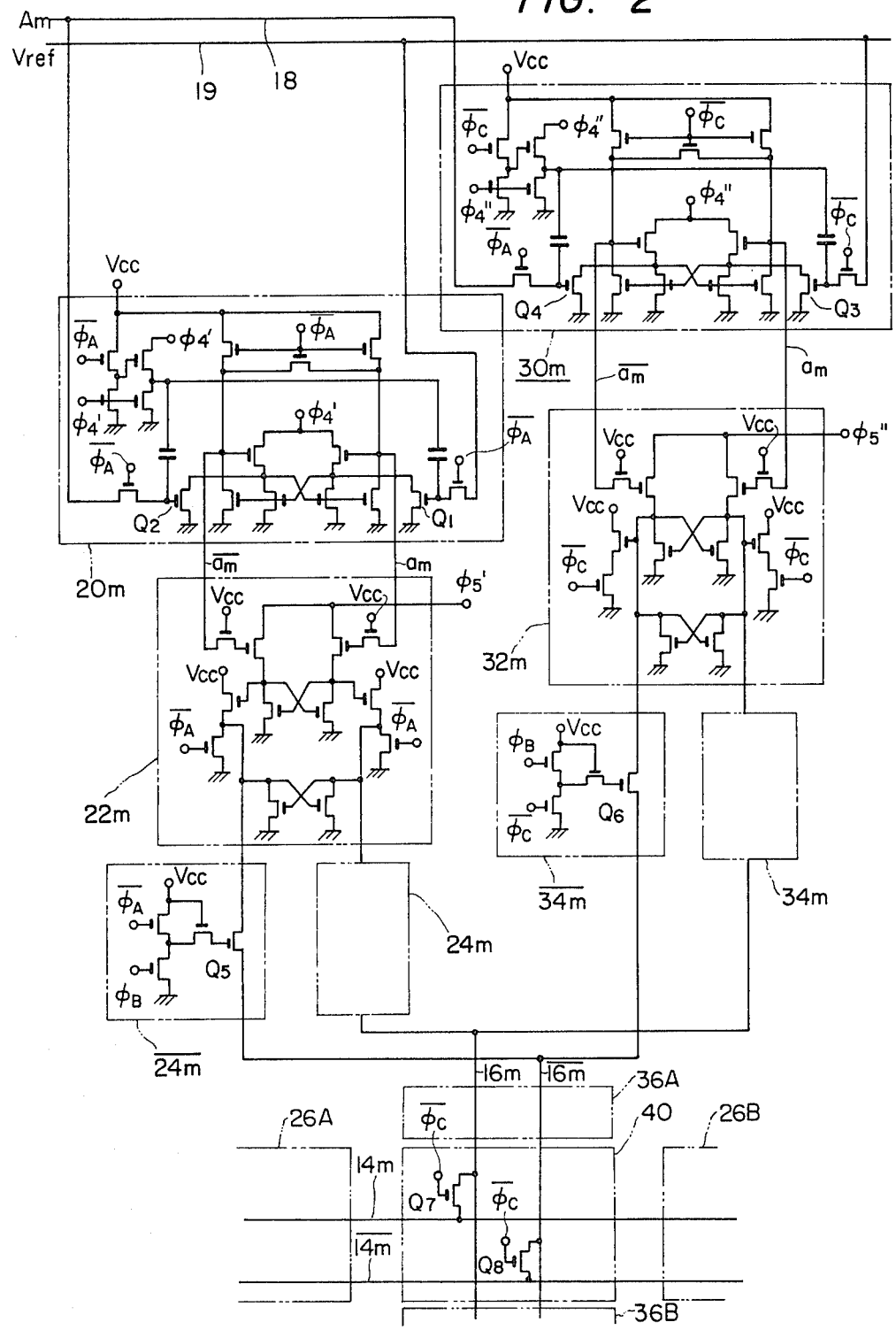
FIG. 2 is a circuit diagram showing in detail such a portion of each block in FIG. 1 as relates to one address bit.

FIG. 2 shows in detail only that portion of the circuit of FIG. 1, which corresponds to one address bit Am. All the transistors, as shown, are N-channel enhancement type MOS transistors.

Figure 3:
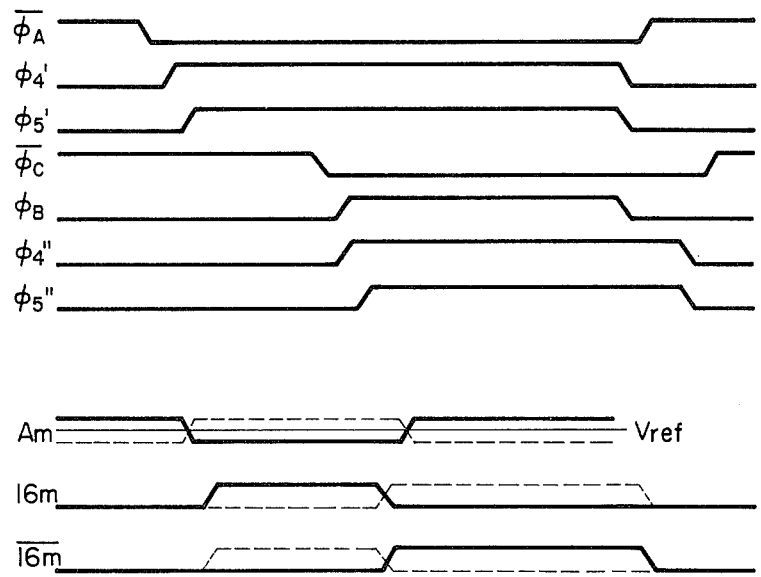
FIG. 3 is a time chart illustrating the waveforms of the respective portions of FIG. 2.

FIG. 3 illustrates the operating waveforms of the respective portions of the circuit shown in FIG. 2. The operations of the circuit shown in FIG. 2 will now be described with reference to FIG. 3. First of all, when the external address signal Am is given so that timing pulses $\phi_A$ have a low level, the potential at the gate of a transistor $Q_2$ of the row address signal generator 20m is held at such a value as corresponds to the level of the external address signal $A_m$. On the other hand, the potential at the gate of a transistor $Q_1$ is held at such a value as corresponds to the reference voltage $V_{ref}$. Next, when timing pulses $\phi_4'$ have a high level, one of the internal address signals $a_m$ and $\bar{a}_m$ takes a high level whereas the other takes a low level in accordance with the levels of the conductances of the transistors $Q_1$ and $Q_2$. If, for example, the external address signal $A_m$ is higher than the reference voltage $V_{ref}$, as indicated at a solid line in FIG. 3, the internal address signal $a_m$ takes the high level. If the external address signal $A_m$ is lower than the reference voltage $V_{ref}$, as indicated at a broken line, on the contrary, the internal address signal $\bar{a}_m$ takes the high level. Next, when timing pulses $\phi_5'$ takes a high level, the aforementioned internal address signals $a_m$ and $\bar{a}_m$ are amplified by the amplifier $22m$ and are impressed upon the switch circuits $24_m$ and $\overline{24}_m$, respectively. Since the timing pulses $\phi_B$ are at the low level during the period until that time, a transistor $Q_5$, as shown to be included in the switch circuit $\overline{24}_m$, is conducting, whereas a transistor $Q_6$, as shown to be included in the switch circuit $\overline{34}_m$, is non-conducting. As a result, the potentials at the common address lines 16m and $\overline{16}_m$ are made to take the output level of the amplifier $22_m$. During this period, moreover, transistors $Q_7$ and $Q_8$ in the switch circuit 40 are also conducting so that the internal address signals are transmitted to the row lines $14_m$ and $\overline{14}_m$, thereby to effect the decoding operations by the row decoders 26A and 26B.

Next, timing pulses $\bar{\phi}_c$ takes a low level, but, in the meantime, the external address signal $A_m$ is changed from a first signal indicating the row address to a second signal indicating the column address. As a result, the gate potential of a transistor $Q_4$ of the column address signal generator $30_m$ holds the level corresponding to that second signal. Next, when timing pulses $\phi_4''$ takes a high level, the internal address signals $a_m$ and $\bar{a}_m$ corresponding to the level of the external address signal $A_m$ are generated by the amplifier $32_m$ similarly to the aforementioned row address generator and are then amplified in response to timing pulses $\phi_5''$ until they are fed to the switch circuits $34_m$ and $\overline{34}_m$. Since, at this time, the timing pulses $\phi_B$ are at the high level whereas the timing pulses $\bar{\phi}_c$ are at the low level, the switch circuits $34_m$ and $\overline{34}_m$ are conducting whereas the switch circuits $24_m$ and $\overline{24}_m$ are non-conducting. As a result, the potentials of the common address lines $16_m$ and $\overline{16}_m$ are made to take the output level of the amplifier $32_m$. Meanwhile, the transistors $Q_7$ and $Q_8$ of the switch circuit 40 are non-conducting so that the decoding operations are performed by the column decoders 36A and 36B.

Figure 4:
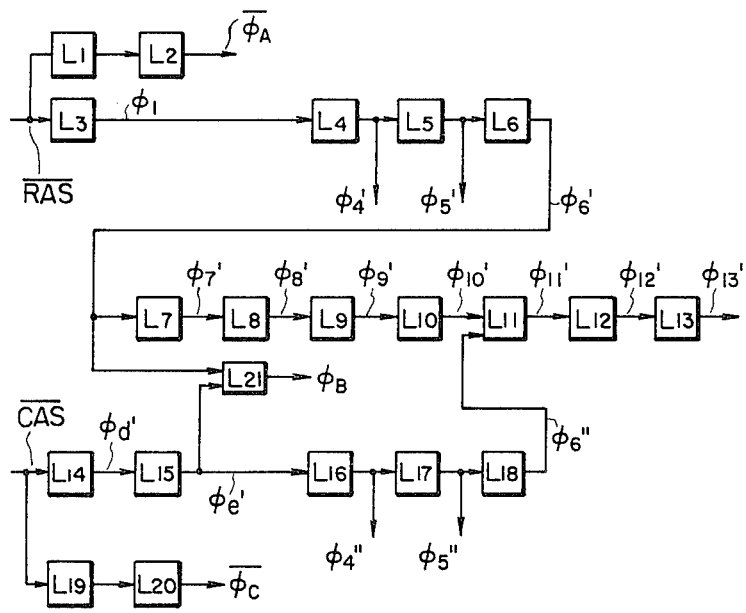
FIG. 4 is a block diagram showing such a circuit of FIG. 2 as generates respective timing pulses.
Figure 5:
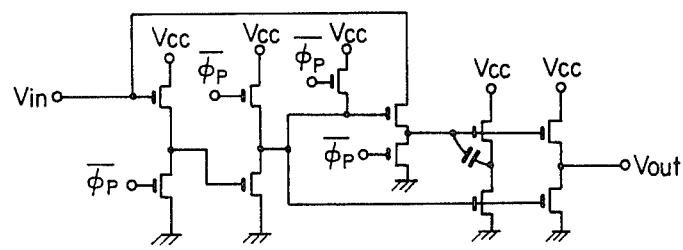
FIG. 5 is a circuit diagram showing one block of FIG. 4.
Figure 6:
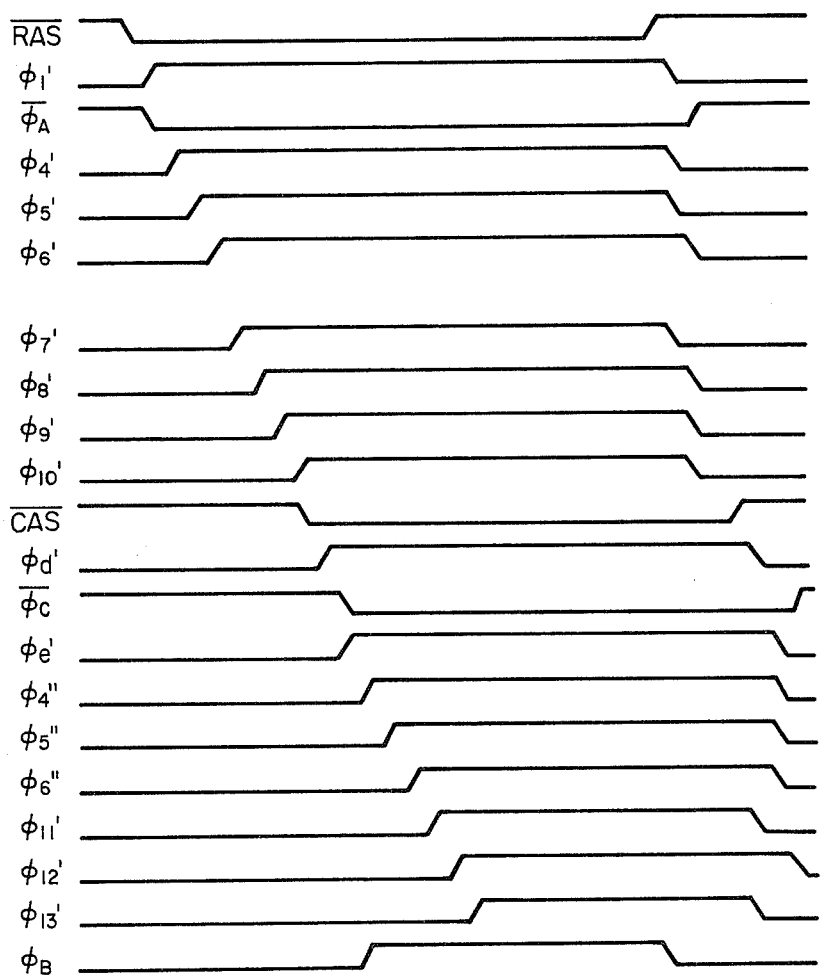
FIG. 6 is a time chart illustrating the waveforms of the respective portions of FIG. 4.

FIG. 4 shows the timing control circuit according to the present embodiment for generating the timing pulses. All blocks $L_1$, $L_2$, ---, and $L_{20}$ except $L_{11}$ are delay circuits having an identical construction. These delay circuits are shown in FIG. 5. On the other hand, blocks $L_{11}$ and $L_{21}$ and AND circuit which are constructed of MOS transistors. FIG. 6 illustrates the waveforms of the respective portions of the circuit shown in FIG. 4. As shown in these figures, the memories of the present embodiment are sequentially driven in response to row and column address strobes $\overline{RAS}$ and $\overline{CAS}$ which are fed from the outside.

Figure 7:
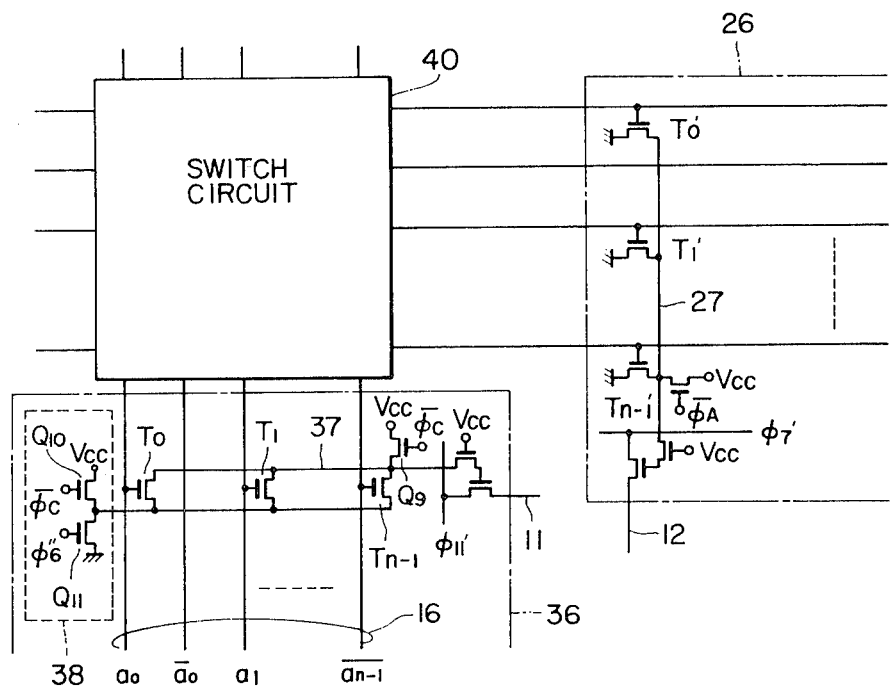
FIG. 7 is a circuit diagram illustrating a portion of FIG. 1.

FIG. 7 shows only the portion which corresponds to one column line and one row line of the column decoders 36A and 36B and row decoders 26A and 26B. A column decoder 36 includes a set of decoding transistors $T_0$, $T_1$, --- and $T_{n-1}$ and a disabling means 38 composed of transistors $Q_{10}$ and $Q_{11}$. Either the true signals or the complementary signals on the common address lines 16 are connected with the gates of the decoding transistors according to the address to be decoded. The row decoder 26 also includes a set of decoding transistors $T_0'$, $T_1'$, --- and $T_{n-1}'$, however, it has no disabling means.

At the first time, a node 27 of the row decoder 26 is precharged by the timing pulses $\bar{\phi}_A$. Next, when the internal address signals from amplifier 22 arise on the row address lines 14, the decoding transistors $T_0'$, $T_1'$, --- and $T_{n-1}'$ are driven and then one of the row lines 12 is selected. Since the timing pulses $\phi_6''$ are at the low level during the period until that time, the transistor $Q_{11}$ of the disabling means 38 is OFF. So the decoding transistors $T_0$, $T_1$, --- and $T_{n-1}$ of the column decoder 36 are not driven by the address signals on the common address lines 16. Next, the internal address signals from the amplifier 32 arise on the common address lines 16. Then the timing pulses $\phi_6''$ become to be at a high level, and the decoding transistors $T_0$, $T_1$, --- and $T_{n-1}$ are driven by the address signals. Thus the one of the column lines 11 is selected.

According to the embodiment thus far described, the column and row address buffers are provided independently of each other while using the common external address lines in the time dividing manner. As a result, the timing control circuit can be made to have the simple construction while enjoying a advantages of the semiconductor memory of multiplexed address inputs according to the prior art. Moreover, since each address buffer operates once during one memory cycle, the memory cycle can be shortened. Still moreover, since the internal address lines are commonly used through the switch circuits, the area occupied by the address lines can be reduced.

Figure 8:
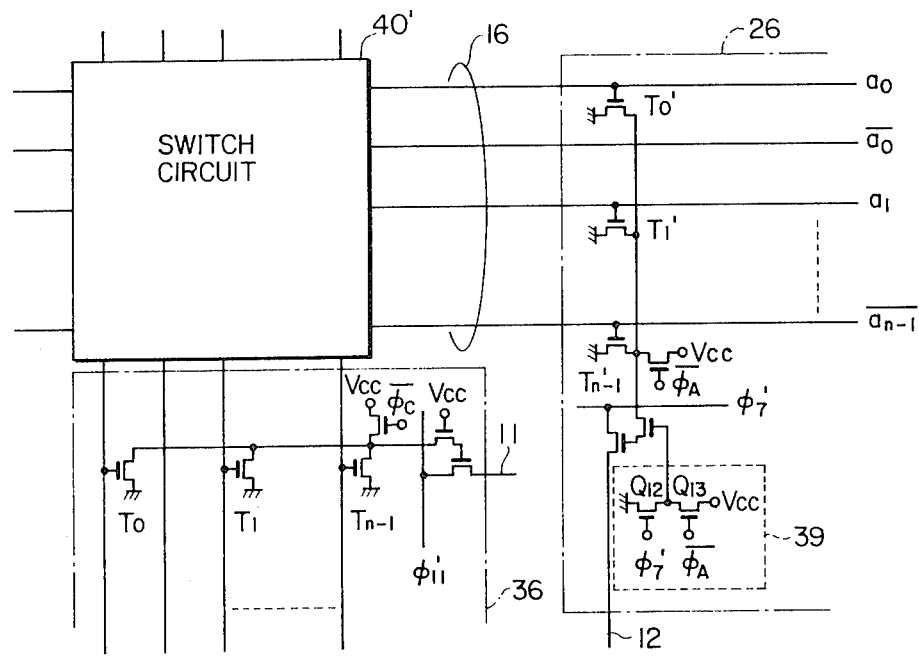
FIG. 8, FIG. 9 and FIG. 10 are circuit diagrams illustrating other embodiments respectively.

Incidentally, in the embodiment, the internal address lines extending through the column decoders are used commonly as the address lines for transmitting the signals to the row decoders. However, the internal address lines extending through the row decoders may be commonly used as alternatives. In this modification, the address singals are transmitted to the column decoders through a switch circuit 40' which are similar to the switch circuits 40. FIG. 8 shows this embodiment. The column decoder 36 is not provided with the disabling means 38. On the other hand, the row decoder 26 is provided with a disabling means 39. The disabling means 39 divide the row line 12 from the decoding transistors $T_0'$, $T_1'$, - - - and $T_{n-1}'$ in the period during which the signals on the common address lines 16 indicate a column address.

Figure 9:
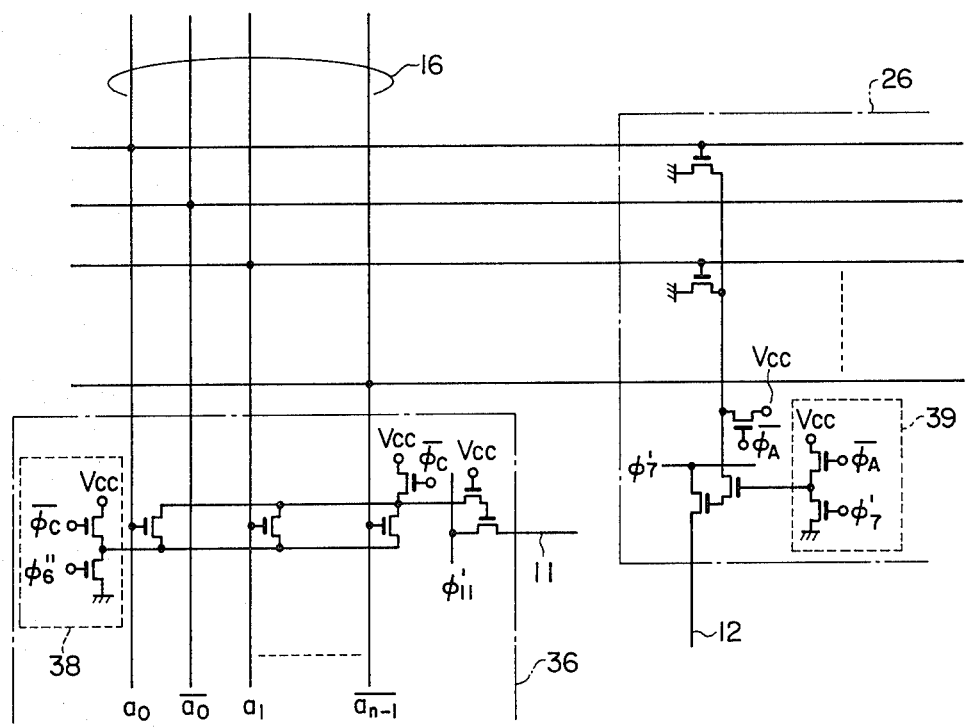

FIG. 9 shows another embodiment in which the both of the row decoder 26 and the column decoder 36 are connected directly with the common address lines 16. In this embodiment, the column decoder 36 is provided with the disabling means 38 and the row decoder 26 is provided with the disabling means 39.

Figure 10:
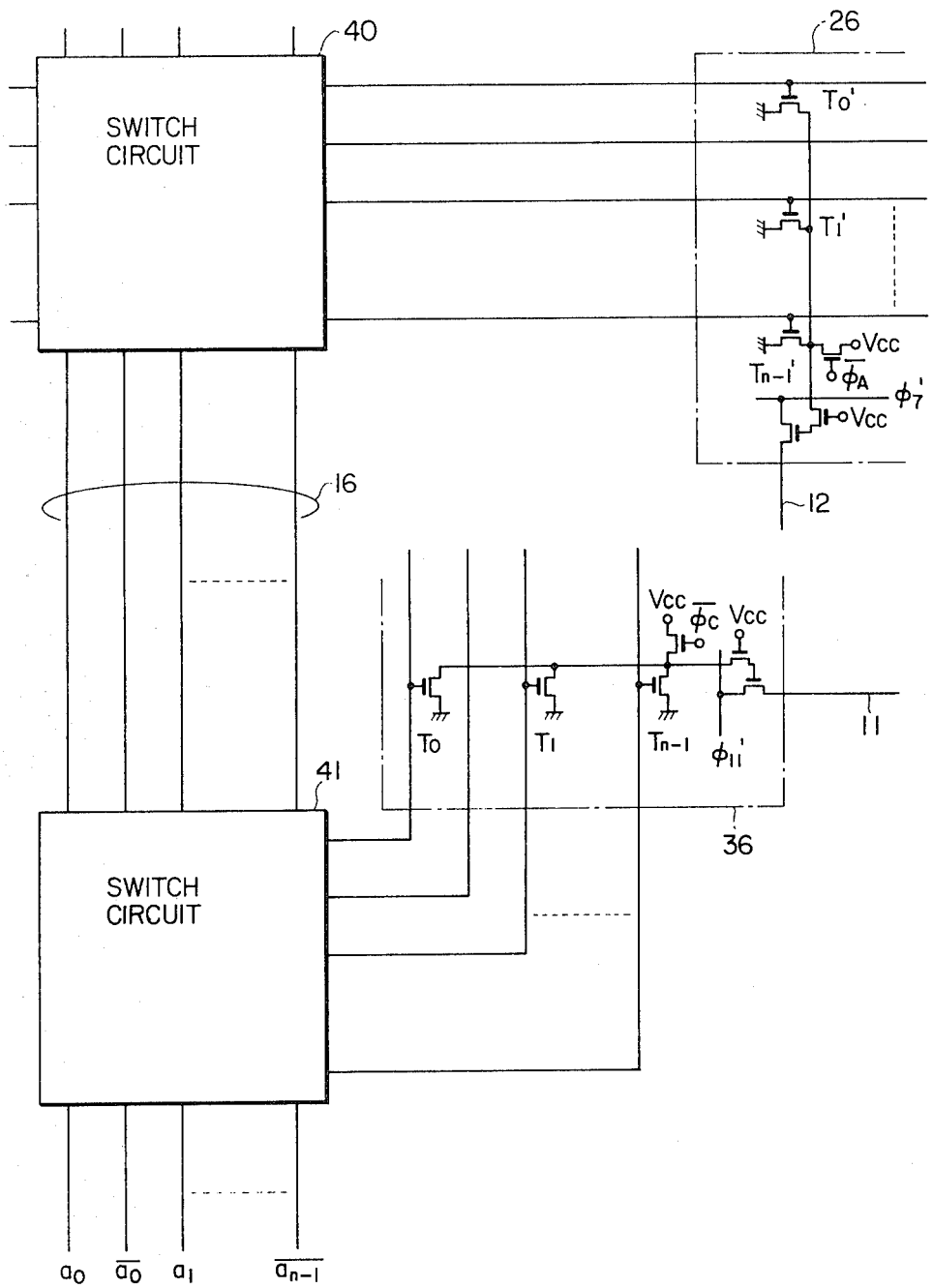

FIG. 10 shows another embodiment in which the row decoder 26 is connected to the common address lines 16 through the switch circuit 40 and the column decoder 36 is connected to the common address line 16 through another switch circuit 41. According to this embodiment, there is no need to provide the row decoder 26 and the column decoder 36 with any disabling means.

What is claimed is:

1. A semiconductor memory comprising:
   a plurality of row lines;
   a plurality of column lines disposed to intersect said row lines;
   a plurality of memory cells disposed at the points of intersection between said column lines and said row lines;
   first and second address buffers respectively for receiving first and second address signals provided thereto through a first common address line in a time-dividing manner respectively to generate corresponding first and second address signals;
   switching means for sequentially providing the corresponding first and second address signals to a second common address line;
   row decoding means for selecting one of said row lines in response to the corresponding first address signal on the second common address line; and
   column decoding means for selecting one of said column lines in response to the corresponding second address signal on the second common address line.

2. A semiconductor memory as set forth in claim 1, wherein one of said row decoding means and said column decoding means is connected through a second switching means with said second common address line.

3. A semiconductor memory as set forth in claim 2, wherein at least one of said row decoding means and column decoding means includes a disabling means.

4. A semiconductor memory as set forth in claim 1, wherein said row decoding means and said column decoding means are connected with said second common address line through a second switching means respectively.

5. A semiconductor memory as set forth in claim 1, wherein said first and second address buffers include means respectively for generating the corresponding address signals composed of a pair of signals, one of which is an inversion of the other.

* * * * *